(12) United States Patent
Jang

(10) Patent No.: US 7,672,191 B2
(45) Date of Patent: Mar. 2, 2010

(54) DATA OUTPUT CONTROL CIRCUIT

(75) Inventor: Ji-Eun Jang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 234 days.

(21) Appl. No.: 11/967,595

(22) Filed: Dec. 31, 2007

(65) Prior Publication Data

US 2009/0116313 A1    May 7, 2009

(30) Foreign Application Priority Data

Nov. 2, 2007    (KR) ...................... 10-2007-0111567

(51) Int. Cl.
*G11C 8/00*    (2006.01)
(52) U.S. Cl. .............................. 365/233.12; 365/233.1; 327/158
(58) Field of Classification Search ............ 365/233.12, 365/233.1; 327/158
See application file for complete search history.

(56) References Cited

U.S. PATENT DOCUMENTS 6,813,197 B2 * 11/2004 Park ........................... 365/194

FOREIGN PATENT DOCUMENTS

KR    1019990075064 A    10/1999

OTHER PUBLICATIONS

Notice of Allowance issued from Korean Intellectual Property Office on May 30, 2009 with an English Translation.

* cited by examiner

*Primary Examiner*—Son Dinh
*Assistant Examiner*—Nam Nguyen
(74) *Attorney, Agent, or Firm*—IP & T Law Firm PLC

(57) ABSTRACT

A data output control circuit includes a data output control circuit configured to compensate a delay amount of a system clock on a clock path when a delay locked loop (DLL) circuit is enabled in such a state that the semiconductor memory device exits a reset state in response to an active signal, and to determine an output timing of data corresponding to a read command by counting the system clock and a DLL clock outputted from the DLL circuit 0 when the DLL circuit 0 is disabled, without compensating the delay amount.

20 Claims, 7 Drawing Sheets

DATA OUTPUT CONTROL CIRCUIT

CROSS-REFERENCE TO RELATED APPLICATIONS

The present invention claims priority of Korean patent application number 10-2007-0111567, filed on Nov. 2, 2007, which is incorporated by reference in its entirety.

BACKGROUND OF THE INVENTION

The present invention relates to a semiconductor memory device, and more particularly, to a data output control circuit that can control the timing of data output so that data corresponding to an external command can be outputted in synchronism with a system clock.

In a system with a variety of semiconductor devices, a semiconductor memory device serves as data storage. The semiconductor memory device outputs data corresponding to addresses received from a data processor, e.g., a central processing unit (CPU), or stores data received from the data processor in unit cells selected according to addresses inputted together with the data.

As the operating speed of the system is increasing, the data processor requires the semiconductor memory device to output and store data at higher speed. For the purpose of high-speed data input and output, a synchronous memory device was developed. The synchronous memory device inputs and outputs data in synchronism with a system clock. However, because even a synchronous memory device could not meet the required data input/output speed, a double data rate (DDR) memory device was developed. The DDR memory device outputs or inputs data at falling edges and rising edges of the system clock.

The DDR memory device must process two data elements during one cycle of the system clock so as to input and output data at a falling edge and a rising edge of the system clock. Specifically, the DDR memory device must output data exactly in synchronism with the rising edge and the falling edge of the system clock. To this end, a data output circuit of the DDR memory device outputs data in synchronism with rising and falling edges of the system clock.

The semiconductor memory device must output data corresponding to an external read command several periods of the system clock after the input of the external command. A column address strobe (CAS) latency (CL) represents the timing of the start of the data output. Generally, the semiconductor memory device supports multiple CLs and can adjust them according to operation environment. The CL is set in a mode register set (MRS). When the external read command is inputted, the semiconductor memory device determines the timing of data output according to the CL set in the MRS.

However, the system clock inevitably is delayed until it arrives at a data output circuit because it passes through a clock input buffer, a clock transmission line, etc. Thus, if the data output circuit outputs data in synchronism with the delayed system clock, an external device will receive data that are not synchronized with rising edges and falling edges of the system clock. To solve this problem, the semiconductor memory device uses a delay locked loop (DLL) circuit to lock a delay of a clock signal. The DLL circuit 450 compensates the delay caused by internal circuits of the semiconductor memory device until the system clock inputted to the semiconductor memory device is transferred to the data output circuit.

In order to output the data in exact correspondence to the external command after the CL, the semiconductor memory device uses a data output control circuit that determines the timing if data output by using a DLL clock outputted from a DLL circuit 450 and a CL set in an MRS. After outputting the DLL clock, the DLL circuit 450 stops the delay locking operation so as to reduce the power consumption when the clock phase is not changed by the change of operation mode or environment of the semiconductor memory device. However, the data output control circuit can continuously output data by using the DLL clock whose phase already has been locked.

FIG. 1 is a block diagram of a data output control circuit in a conventional semiconductor memory device. The data output control circuit outputs data in synchronism with a (DLL) clock outputted from a DLL circuit 450, or outputs data in synchronism with an external system clock when the DLL circuit 450 does not perform the delay locking operation.

Referring to FIG. 1, the data output control circuit includes a first timing computation unit 120, a second timing computation unit 140, and a data output timing computation unit 160. The first timing computation unit 120 counts a DLL clock outputted from a DLL circuit 450, and the second timing computation unit 140 counts an external system clock. The data output timing computation unit 160 determines data output timing by detecting a timing at which an output of the first timing computation unit 120 is equal to an output of the second timing computation unit 140 when an external command is inputted.

Specifically, the first timing computation unit 120 includes a DLL reset synchronizer 122, an initial value determining unit 126, and a first clock counter 124. The second timing computation unit 140 includes an external clock synchronizer 142, a latch 144, a multiplexer 146, and a second clock counter 148. The data output timing computation unit 160 receiving the output of the first timing computation unit 120 and the output of the second timing computation unit 140 includes a comparator 162, a signal generator 164, and an output enable signal output buffer 166.

The DLL reset synchronizer 122 of the first timing computation unit 120 outputs a DLL reset signal DLLRST indicating a timing at which an output reset signal OERST is deactivated to a logic low level in synchronism with a DLL clock RCLKDLL outputted from a DLL circuit 450, that is, a timing at which the semiconductor memory device exits a reset state. The output reset signal OERST is activated according to an operation mode of the semiconductor memory device. When the semiconductor memory device enters a power-down mode, the output reset signal OERST is activated to a logic high level to reset an output enable signal OE. When the output reset signal OERST is deactivated to a logic low level in response to an external active signal, the semiconductor memory device exits the reset state. The DLL reset signal DLLRST is inputted to the first clock counter 124 to count the DLL clock outputted from the DLL circuit 450. An initial value of the first clock counter 124 is determined by the initial value determining unit 126. The determined initial value can be changed according to designs, but is dependent on a column address strobe (CAS) latency (CL).

The DLL reset signal DLLRST outputted from the DLL reset synchronizer 122 is inputted to the second timing computation unit 140 through a replica delay line 130. The replica delay line 130 compensates a phase difference between the external system clock and the DLL clock. Generally, the replica delay line 130 is similar to a replica delay circuit of the DLL circuit 450 and models a delay value that the system clock experiences within the semiconductor memory device.

The second timing computation unit 140 receives a delayed DLL reset signal DLLRST_REP from the replica delay line 130 and outputs a counting result of a rising edge of the system clock. The external clock synchronizer 142 receives the delayed DLL reset signal DLLRST_REP and an external clock bar signal EXTCLKB. The external clock synchronizer 142 transfers the delayed DLL reset signal DLLRST_REP in synchronism with the falling edge of the system clock, and the latch 144 latches the delayed DLL reset signal DLLRST_REP in synchronism with the falling edge of the system clock. The multiplexer 146 selectively outputs the output of the external clock synchronizer 142 and the output of the latch 144 as an external reset signal EXTRST in response to a DLL disable signal DISDLL. When the external reset signal EXTRST is at a logic low level, the second clock counter 148 counts the rising edges of the system clock in response to the external reset signal EXTRST. An initial value of the second clock counter 148 is set to "0" and counts up to "7" and outputs the counting result signal EXTCNT<0:2>.

The result signals DLLCNT<0:2> and EXTCNT<0:2> outputted from the first and second clock counters 124 and 148 are inputted to the comparator 162 of the data output timing computation unit 160. The comparator 162 holds the result signal EXTCNT<0:2> outputted from the second clock counter 148 when the external command is inputted, generates a delay source signal LATB during a period at which the result signal EXTCNT<0:2> is equal to the result signal DLLCNT<0:2> outputted from the first clock counter 124, and outputs a delay signal LATENCYB in synchronism with the falling edge of the system clock. The signal generator 164 generates pulses in synchronism with the rising and falling edges of the system clock in response to the delay signal LATENCYB. The output enable signal output buffer 166 outputs a rising data signal RCLK_D0 in synchronism with the DLL clock RCLKDLL during an activation period of the pulse in response to one of the pulses outputted from the signal generator 164. The rising data signal RCLK_D0 is a basis of a data strobe signal (DQS) outputted together with data (Q0-Q7).

FIG. 2 is a timing diagram illustrating the operation of the data output control circuit of FIG. 1 in a low frequency environment.

Referring to FIG. 2, the data output control circuit generates the rising data signal RCLK_D0 for outputting data corresponding to the read command when the output reset signal OERST changes from the reset state to the deactivated state according to the operation mode of the semiconductor memory device.

First, the output reset signal OERST exits the reset state in response to the active signal, so that it becomes a logic low level. Thereafter, the DLL reset signal DLLRST becomes a logic low level in synchronism with the falling edge of the DLL clock RCLKDLL. The first clock counter 124 counts the rising edges of the DLL clock RCLKDLL in response to the DLL reset signal DLLRST and outputs the result signal DLLCNT<0:2>. The initial value of the first clock counter 124 using a 3-bit counter is 8−(CL−3). For example, when the CAS latency (CL) is 6, the initial value of the first clock counter 124 is 5.

The DLL reset signal DLLRST is delayed by the replica delay line 130 and then inputted to the second timing computation unit 140. The external clock synchronizer 142 receives the delayed DLL reset signal DLLRST_REP from the replica delay line 130 and transfers it in synchronization with the falling edge of the system clock EXTCLK. The multiplexer 146 outputs the delayed DLL reset signal DLLRST_REP as the external reset signal EXTRST. When the DLL circuit 450 of the semiconductor memory device is enabled, the multiplexer 146 outputs the output signal of the latch 144 as the external reset signal EXTRST. When the external reset signal EXTRST becomes a logic low level, the second clock counter 148 counts the rising edges of the system clock EXTCLK and outputs the counting result signal EXTCNT<0:2>. The initial value of the second clock counter 148 is 0 and counts up to 7 in a circular manner.

When the external read command RD is inputted, the semiconductor memory device generates a read pulse CASP10RD corresponding to the read command RD. When the read pulse CASP10RD is activated, the comparator 162 holds the result signal EXTCNT<0:2>=2 outputted from the second clock counter 148. Thereafter, when the result signal DLLCNT<0:2> outputted from the first clock counter 124 is 2, the comparator 162 outputs the delay signal LATENCYB. When the delay signal LATENCYB is at a logic low level, the signal generator 164 generates the output source signals from after the falling edge of the system clock EXTCLK. The output source signals ROUTEN, ROUTEN1, ROUTEN15, ROUNT2 and ROUNT25 are outputted in synchronism with the falling and rising edges of the system clock EXTCLK. The output enable signal output buffer 166 generates the rising data signal RCLK_D0 based on the DLL clock RCLKDLL while one signal ROUTEN15 of the output source signals is activated.

The output timing of the data corresponding to the read command RD is "AL+CL" when the DLL circuit 450 is in an enabled state and is "AL+(CL−1)+tAC" when the output timing of the data is in a disabled state. "AL" represents an additive latency", and "tAC" represents an access time.

As described above, the initial value of the first clock counter 124 is 8−(CL−3). "8" means that the 3-bit counter is used to count eight from zero to seven. "CL−3" means a timing at which the delay signal LATENCYB is outputted from the comparator 162. If assuming that AL and tAC are 0 tCK as illustrated in FIG. 2, the rising data signal RCLK_D0 can be outputted at a (CL−1) timing by using the signal ROUTEN15 generated by delaying the delay signal LATENCYB by 1.5 tCK among the output source signals of the signal generator 164. Since it was assumed that CL=6, the rising data signal RCLK_D0 can be outputted after 5 tTCK from the input of the read command.

FIG. 3 is a timing diagram for explaining the problems of the data output control circuit of FIG. 1 in a high frequency environment. As illustrated, when the system clock has a high frequency, the data output timing of the data output control circuit in the same conditions of FIG. 2 is "AL+(CL−2)+tAC", not "AL+(CL−1)+tAC.

The DLL reset signal DLLRST transferred from the first timing computation unit 120 to the second timing computation unit 140 is delayed by the replica delay line 130. The replica delay line 130 delays the DLL reset signal DLLRST by a delay modeling value of the system clock EXTCLK, without regard to the enabling or disabling of the DLL circuit 450 and the frequency of the system clock EXTCLK.

However, when the frequency of the system clock EXTCLK is high, the delay amount of the replica delay line 130 affects the output of the second clock counter 148 of the second timing computation unit 140. That is, due to the delay amount of the replica delay line 130, the delayed DLL reset signal DLLRST_REP may not be synchronized with a next falling edge of the system clock EXTCLK in the external clock synchronizer 142 of the second timing computation unit 140. In this case, the result outputted from the second clock counter 148 decrease by 1 than expected, and the data is outputted earlier than the expected timing by one period of the system clock EXTCLK. Consequently, as the frequency of the system clock increases, the frequency of the DLL CLK also increases. However, there is no change in the delay value of the replica delay line compensating the delay amount of the system clock within the semiconductor memory device. Thus, the conventional semiconductor memory device is not suitable for high frequency operation because it determines the data output timing by counting the system clock and the rising edges of the DLL clock.

SUMMARY OF THE INVENTION

Embodiments of the invention are directed to providing a data output control circuit that can output data according to a preset data output timing even though a DLL circuit 450 is disabled in a semiconductor memory device using a system clock with a high frequency.

In accordance with an aspect of the invention, there is provided a data output control circuit includes a data output control circuit configured to compensate a delay amount of a system clock on a clock path when a delay locked loop (DLL) circuit is enabled in such a state that the semiconductor memory device exits a reset state in response to an active signal, and to determine an output timing of data corresponding to a read command by counting the system clock and a DLL clock outputted from the DLL circuit 450 when the DLL circuit 450 is disabled, without compensating the delay amount.

In accordance with the embodiments of the invention, the data output control circuit for controlling the output timing of the data corresponding to the external read command can overcome the limitations in the usable frequency of the system clock by compensating the delay occurring when the system clock is transferred within the semiconductor memory device. Thus, even though the DLL circuit 450 is in the disabled state, the data can be outputted according to the preset data output timing. To this end, the data output control circuit computes the data output timing when the DLL circuit 450 is in the disabled state, without compensating the delay of the system clock, and computes the data output timing by compensating the delay of the system clock when the DLL circuit 450 is in the enabled state. Accordingly, the data output control circuit can satisfy the preset data output timing according to the enabling and disable of the DLL circuit 450 even in the high frequency environment.

DESCRIPTION OF SPECIFIC EMBODIMENTS

Hereinafter, a data output control circuit in accordance with the invention will be described in detail with reference to the accompanying drawings.

Figure 4:
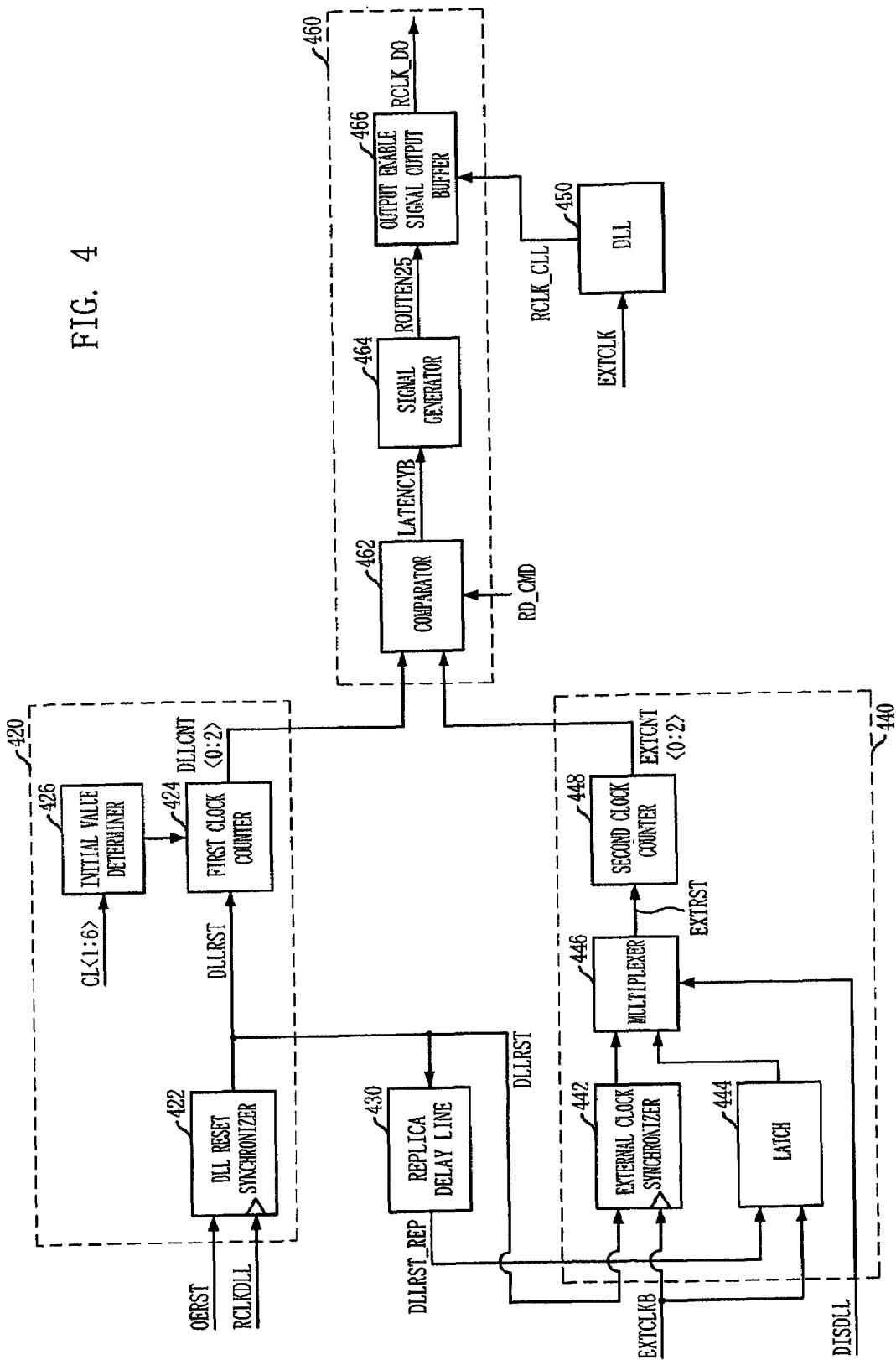
FIG. 4 is a block diagram of a data output control circuit of a semiconductor memory device in accordance with an embodiment of the invention.

FIG. 4 is a block diagram of a data output control circuit of a semiconductor memory device in accordance with an embodiment of the invention.

Referring to FIG. 4, the data output control circuit includes a first timing computation unit 420, a replica delay line 430, a second timing computation unit 440, and a data output timing computation unit 460. The first timing computation unit 420 counts a DLL clock RCLKDLL after the semiconductor memory device exits a reset state in response to an active signal. The replica delay line 430 delays the reset state exit by a delay amount that a system clock experiences on a clock path. The second timing computation unit 440 counts the system clock EXTCLK when a DLL circuit 450 is enabled and the semiconductor memory device exits the reset state, and counts the system clock EXTCLK according to an output of the replica delay line 430 when the DLL circuit 450 is disabled. The data output timing computation unit 460 holds an output of the second timing computation unit 440 when a read command RD_CMD is inputted, and determines a data output timing by detecting a timing at which an output of the first timing computation unit 420 is equal to the output of the second timing computation unit 440.

Specifically, the first timing computation unit 420 includes a DLL reset synchronizer 422, an initial value determining unit 426, and a first clock counter 424. The second timing computation unit 440 includes an external clock synchronizer 442, a latch 444, a multiplexer 446, and a second clock counter 448. The data output timing computation unit 460 receives the output of the first timing computation unit 420 and the output of the second timing computation unit 440 and includes a comparator 462, a signal generator 464, and an output enable signal output buffer 466. The replica delay line 430 compensates a phase difference between the external system clock CLK and the DLL clock RCLKDLL. The replica delay line 430 is similar to a replica delay circuit of the DLL circuit 450 and models a delay value that the system clock experiences within the semiconductor memory device.

Although not shown, the semiconductor memory device includes a DLL circuit 450 that is enabled according to an operation mode, compensates a delay amount that the system clock experiences on an internal clock path, and generates a DLL clock used as a reference of an internal operation. When the semiconductor memory device performs a normal operation such as a read operation and a write operation, the DLL circuit 450 is enabled to perform a delay locking operation. However, when the semiconductor memory device enters a power-down mode, the DLL circuit 450 is disabled and continuously outputs the DLL clock without performing the delay locking operation so as to reduce the power consumption.

Unlike the related art, in case where the semiconductor memory device exits the reset state in response to the active signal, when the DLL circuit 450 is in an enabled state, the data output control circuit compensates the delay amount which the system clock is delayed by on the clock path. However, when the DLL circuit 450 is a disabled state, the data output control circuit determines an output timing of the data corresponding to the read command by counting the system clock EXTCLK and the DLL clock RCLKDLL without compensating the delay amount.

The DLL reset synchronizer 422 of the first timing computation unit 420 outputs a DLL reset signal DLLRST indicating a timing at which an output reset signal OERST is deactivated to a logic low level in synchronism with the DLL clock RCLKDLL outputted from the DLL circuit 450, that is, a timing at which the semiconductor memory device exits the reset state. The DLL reset signal DLLRST is inputted to the first clock counter 424 to count the DLL clocks outputted from the DLL circuit 450. An initial value of the first clock counter 424 is determined by the initial value determining unit 426. The determined initial value may be changed according to designs, but is dependent on a column address strobe (CAS) latency (CL).

The DLL reset signal DLLRST outputted from the DLL reset synchronizer 422 is inputted to the latch 444 of the second timing computation unit 440 through the replica delay line 430, or is inputted to the external clock synchronizer 442 of the second timing computation unit 440 without passing through the replica delay line 430. When the DLL circuit 450 is enabled to perform the delay locking operation, the second timing computation unit 440 receives a delayed DLL reset signal DLLRST_REP from the replica delay line 430 and outputs a counting result of rising edges of the system clock EXTCLK. On the other hand, when the DLL circuit 450 is disabled, the second timing computation unit 440 outputs a counting result of rising edges of the system clock EXTCLK in response to the DLL reset signal DLLRST.

The external clock synchronizer 442 transfers the DLL reset signal DLLRST in synchronism with the falling edge of the system clock EXTCLK, and the latch 444 latches the delayed DLL reset signal DLLRST_REP in synchronism with the falling edge of the system clock EXTCLK. The multiplexer 446 selectively outputs one of the outputs of the external clock synchronizer 442 and the latch 444 as an external reset signal EXTRST in response to a DLL disable signal DISDLL indicating the enable state of the DLL circuit 450. When the external reset signal EXTRST is at a logic low level, the second clock counter 448 counts the rising edges of the system clock EXTCLK in response to the external reset signal EXTRST.

The result signals DLLCNT<0:2> and EXTCNT<0:2> outputted from the first and second clock counters 424 and 448 are inputted to the comparator 462 of the data output timing computation unit 460. The comparator 462 holds the result signal EXTCNT<0:2> outputted from the second clock counter 448 when the external command is inputted, generates a delay source signal when the result signal EXTCNT<0:2> is equal to the result signal DLLCNT<0:2> outputted from the first clock counter 424, and outputs a delay signal LATENCYB in synchronism with the falling edge of the system clock EXTCLK. The signal generator 464 generates pulses in synchronism with the rising and falling edges of the system clock EXTCLK in response to the delay signal LATENCYB. The output enable signal output buffer 466 outputs a rising data signal RCLK_D0 in synchronism with the DLL clock RCLKDLL during an activation period of the pulse in response to one of the pulses outputted from the signal generator 464. The rising data signal RCLK_D0 is a basis of a data strobe signal (DQS) outputted together with data (Q0-Q7).

Figure 1:
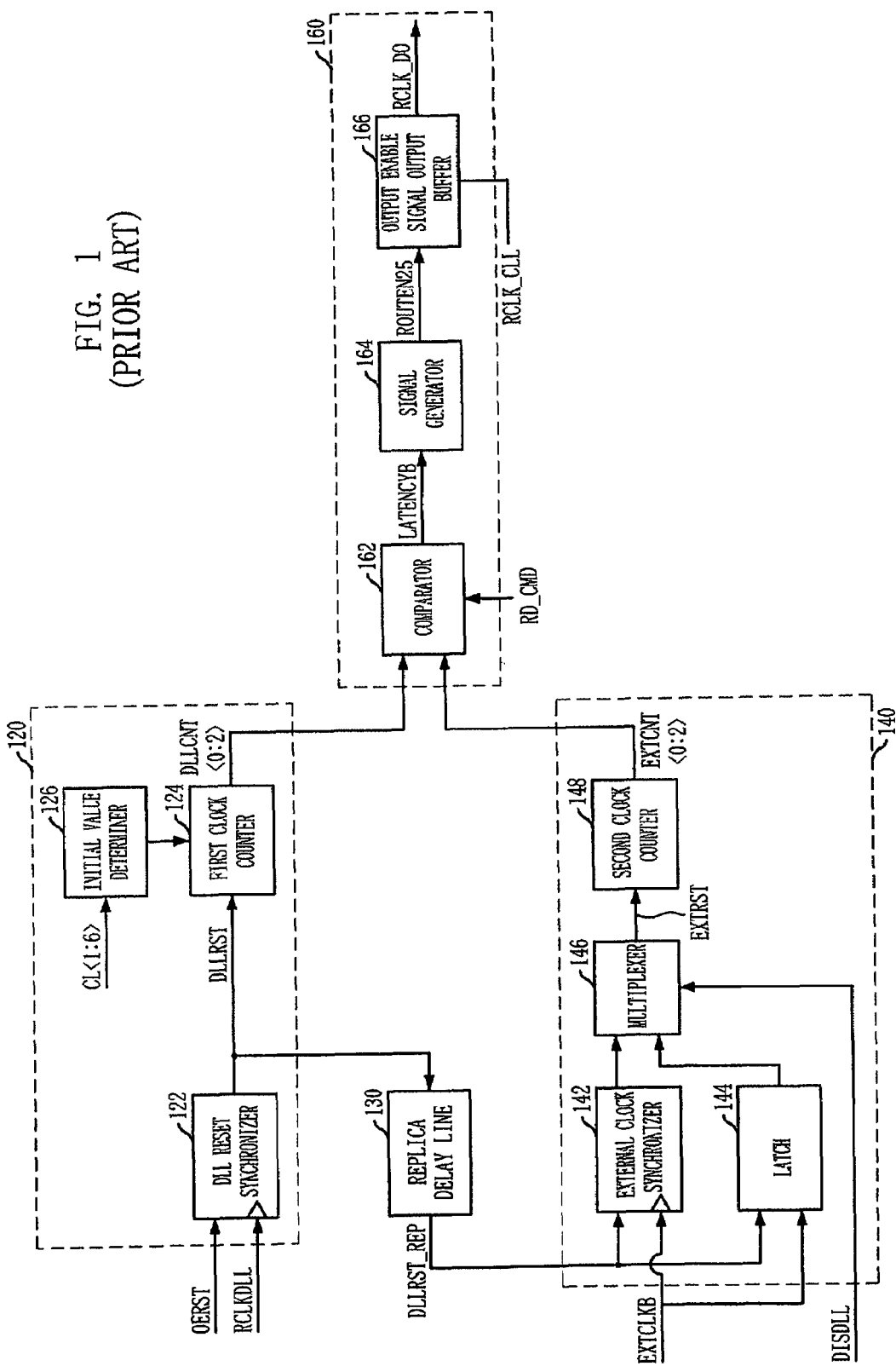
FIG. 1 is a block diagram of a data output control circuit in a conventional semiconductor memory device.
Figure 2:
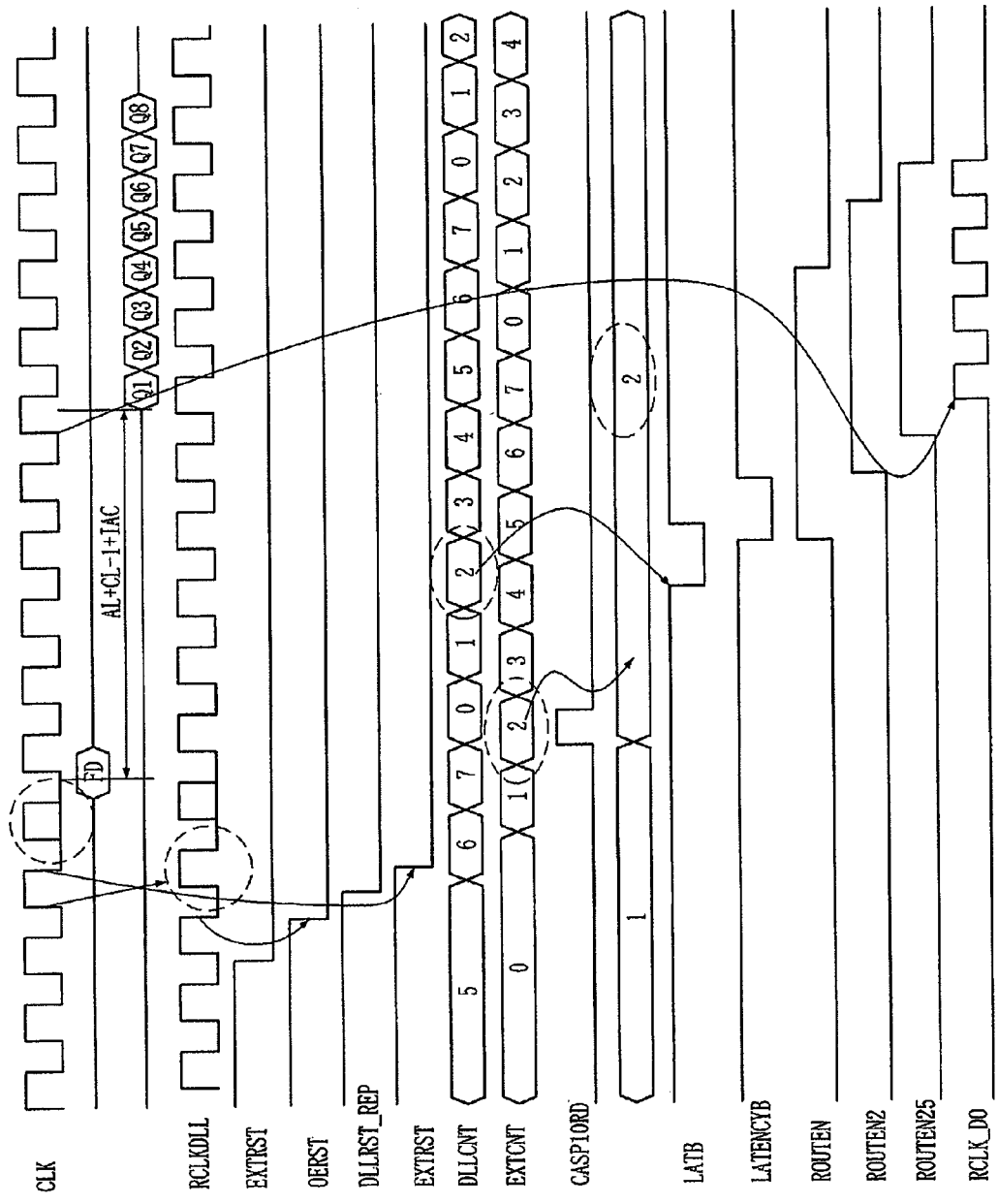
FIG. 2 is a timing diagram illustrating the operation of the data output control circuit of FIG. 1 in a low frequency environment.
Figure 3:
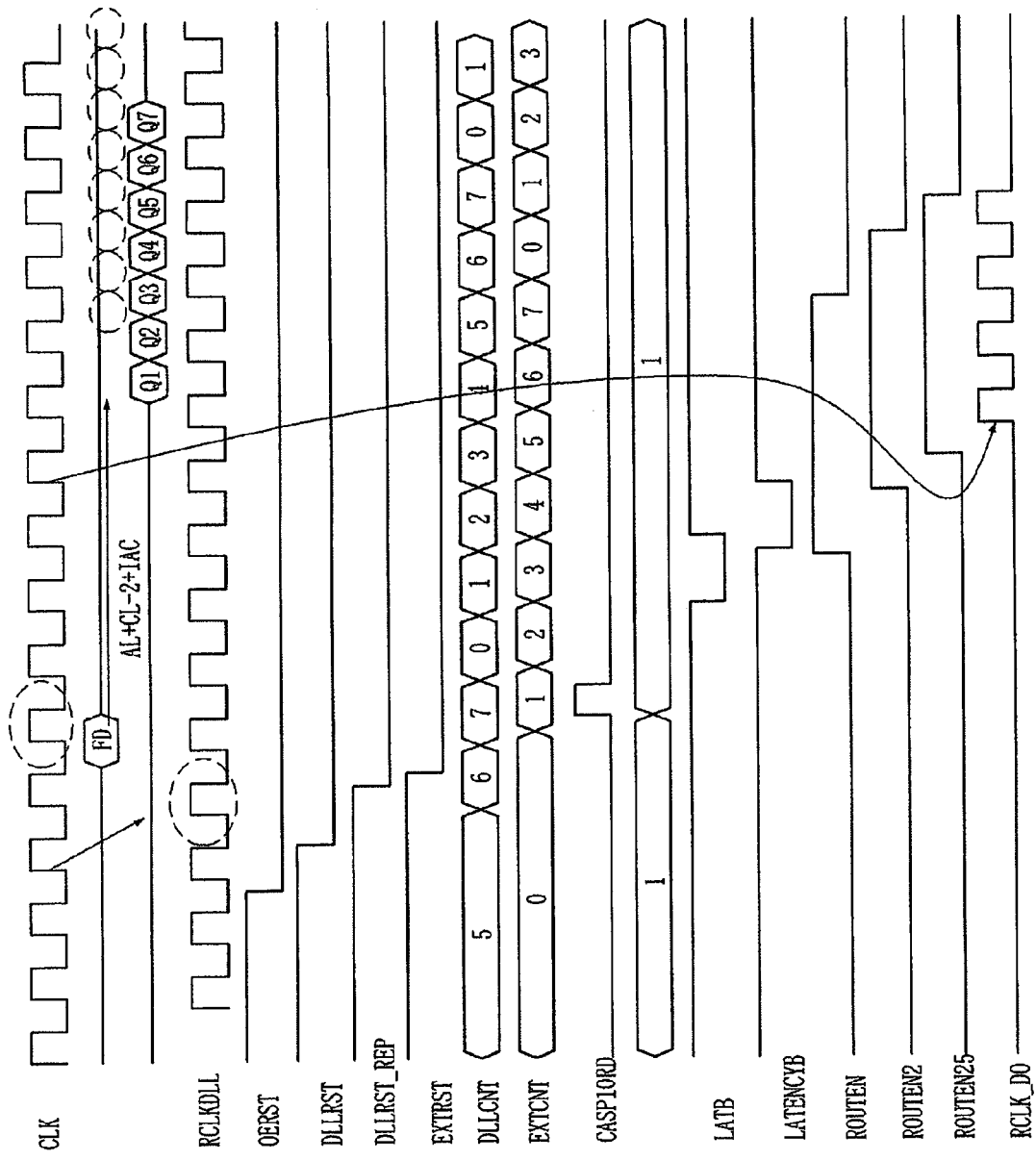
FIG. 3 is a timing diagram for explaining the problems of the data output control circuit of FIG. 1 in a high frequency environment.
Figure 5:
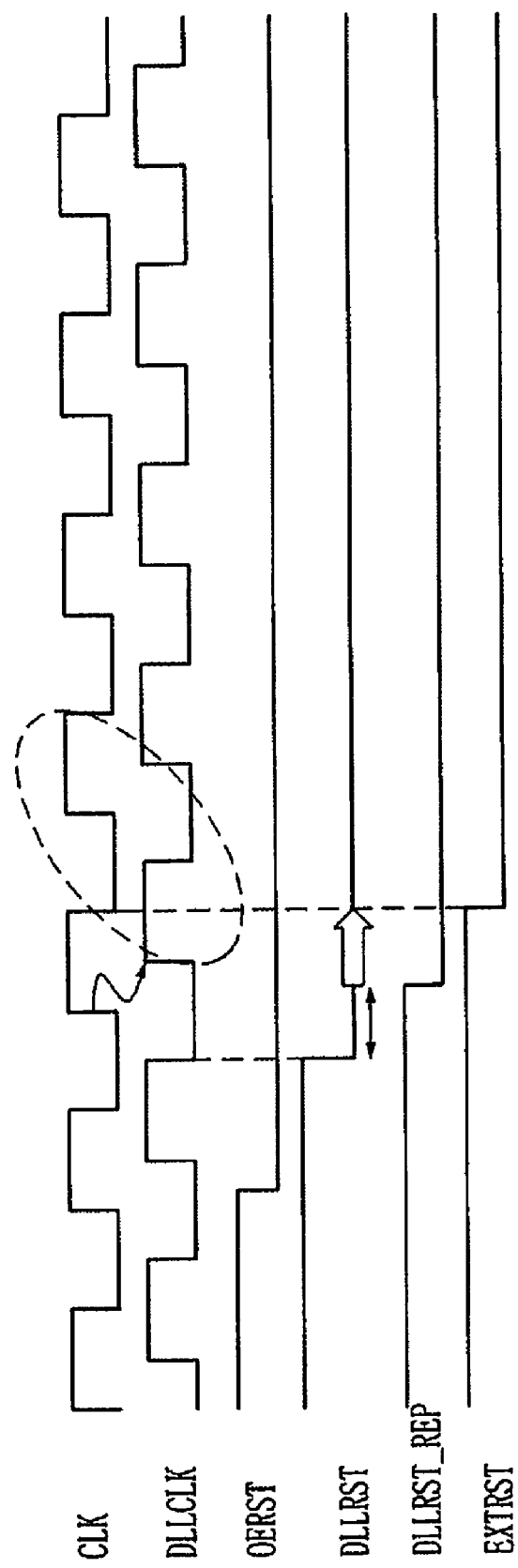
FIG. 5 is a timing diagram illustrating the operation of the data output control circuit of FIG. 1 in a low frequency environment.
Figure 6:
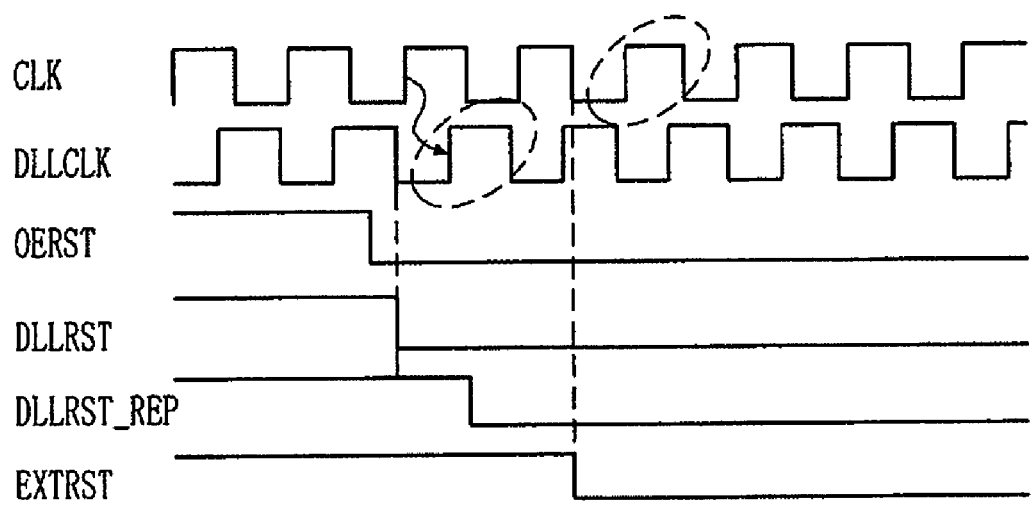
FIG. 6 is a timing diagram for explaining the problems of the data output control circuit of FIG. 1 in a high frequency environment.

FIG. 5 is a timing diagram illustrating the operation of the data output control circuit of FIG. 1 in a low frequency environment, and FIG. 6 is a timing diagram for explaining the problems of the data output control circuit of FIG. 1 in a high frequency environment.

As described above, when the DLL is in a disabled state, the output timing of the data corresponding to the read command RD is "AL+(CL−1)+tAC". To meet "(CL−1)+tAC" except the additive latency AL, when the semiconductor memory device exits the reset state, the data output control circuit starts count the rising edges of the DLL clock DLLCLK and is controlled to count the system clock EXTCLK from its first rising edge after the rising edge of the DLL clock DLLCLK as illustrated in FIG. 5.

Unlike in the low frequency environment of FIG. 5, in the high frequency environment of FIG. 6, the logic level transition of the delayed DLL reset signal DLLRST_REP occurs later than the falling edge of the system clock EXTCLK due to the replica delay line 130 of the data output control circuit. In this case, the external reset signal EXTRST causes the level transition at a timing lengthened by one period of the desired system clock CLK. Thus, the output of the second clock counter 448 counting the rising edges of the system clock EXTCLK may be reduced by 1 than the desired one.

Figure 7:
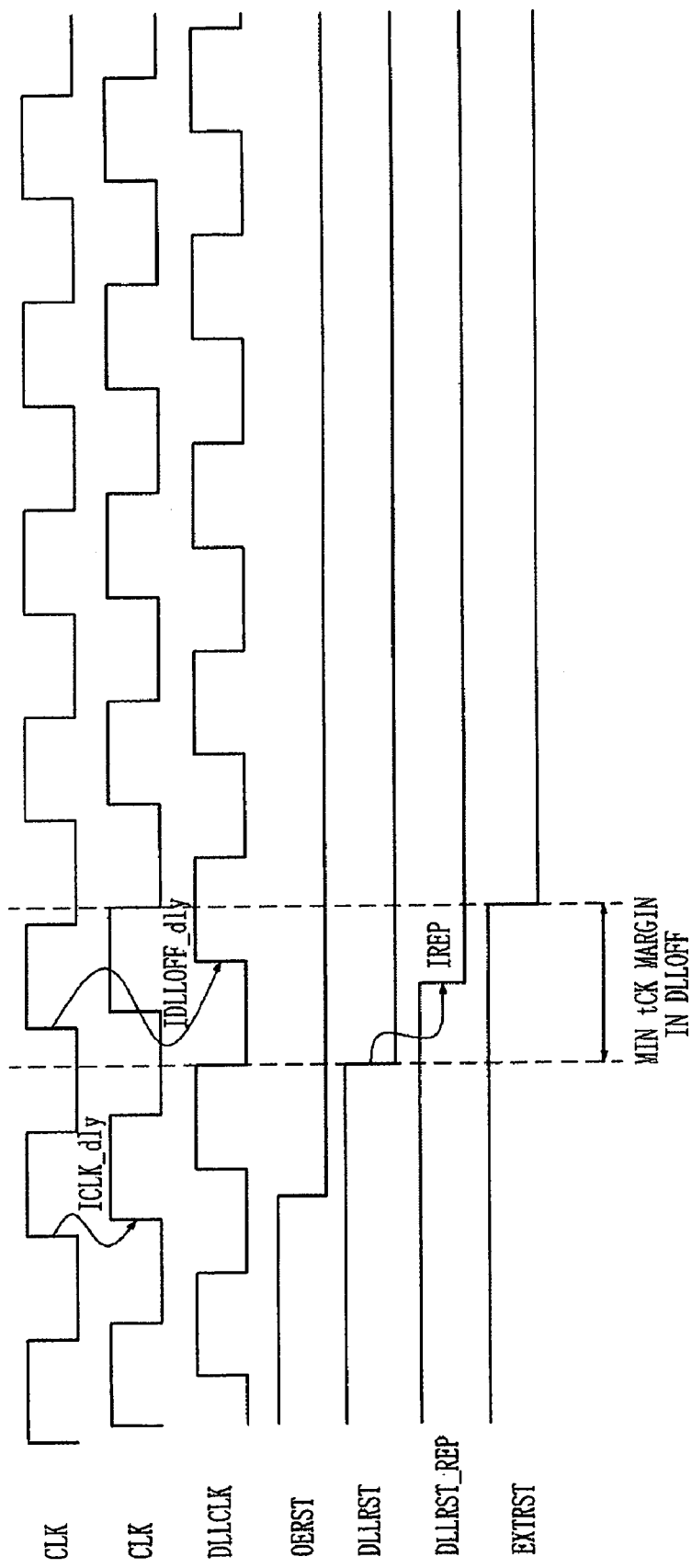
FIG. 7 is a timing diagram for analyzing the problem of the data output control circuit of FIG. 1.

FIG. 7 is a timing diagram for analyzing the problem of the data output control circuit of FIG. 1. As described above in FIG. 6, the conventional data output control circuit may cause the problems during the high frequency operation due to the delay amount of the replica delay line 130, without regard to the frequency of the clock. An operation margin will be quantitatively analyzed.

When the DLL circuit 450 is in a disabled state, the period tCK of the system clock EXTCLK that can be used in the conventional semiconductor memory device must be greater than (tREP+tDLLOFF_DLY−tCLK_DLY). As illustrated in FIG. 7, "tREP" represents the delay amount of the replica delay line 130, "tCLK_DLY" represents the delay amount which the system clock EXTCLK experiences when it is transferred to the internal data output control circuit, and "tDLLOFF_DLY" represents the phase delay amount of the DLL clock DLLCLK corresponding to the system clock EXTCLK. "tREF" has a predetermined delay amount, independently of the frequency of the system clock EXTCLK or the DLL clock RCLKDLL. Therefore, even though there is no problem in the low frequency environment as illustrated in FIG. 5, there occurs the problem in the high frequency environment as illustrated in FIG. 6.

To solve the problems, the replica delay line 430 determines whether to delay the DLL reset signal DLLRST by tREP according to the enabling or disabling of the DLL circuit 450. As illustrated in FIG. 4, when the DLL circuit 450 is enabled, the multiplexer 446 selects the output of the latch 444 and output the external reset signal EXTRST to which the delay amount of the replica delay line 430 is reflected. When the DLL is disabled, the multiplexer 446 selects the output of the external clock synchronizer 442 and outputs the external reset signal EXTRST to which the delay amount of the replica delay line 430 is not reflected. Therefore, the data output control circuit in accordance with the embodiment of the invention can prevent the malfunction in the high frequency operation of FIG. 6.

In accordance with the embodiments of the invention, the data output control circuit can satisfy the preset data output timing in the environments using the system clock with high frequency, regardless of the enabling and disabling of the DLL circuit 450. For example, in the case of double data rate version 3 (DDR3) memory device, the data output timing is AL+(CL−1)+tAC when the DLL circuit 450 is in the disabled state and "AL+CL" when the DLL circuit 450 is in the enabled state.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising a data output control circuit configured to compensate a delay amount of a system clock on a clock path when a delay locked loop (DLL) circuit is enabled in such a state that the semiconductor memory device exits a reset state in response to an active signal, and to determine a timing of data output corresponding to a read command by counting the system clock and a DLL clock outputted from the DLL circuit without compensating the delay amount when the DLL circuit is disabled in such a state that the semiconductor memory device exits a reset state in response to an active signal.

2. The semiconductor memory device as recited in claim 1, wherein the data output control circuit comprises:
   a first timing computation unit configured to count the DLL clock after the semiconductor memory device exits the reset state;
   a replica delay line configured to delay the reset state exit by the delay amount;
   a second timing computation unit configured to count the system clock in response to an output of the replica delay line when the DLL circuit 0 is in the disabled state; and
   a data output timing computation unit configured to hold an output of the second timing computation unit when the read command is inputted, and determine the output timing based on a timing when the output of the second timing computation unit is equal to the output of the first timing computation unit.

3. The semiconductor memory device as recited in claim 2, wherein the second timing computation unit counts the system clock, when the DLL circuit 0 is enabled and the semiconductor memory device exits the reset state.

4. The semiconductor memory device as recited in claim 3, wherein the first timing computation unit comprises:
   a DLL reset synchronizer configured to output an output reset signal, which is deactivated in response to the active signal, in synchronism with a falling edge of the DLL clock;
   a first clock counter configured to count rising edges of the DLL clock in response to an output of the DLL reset synchronizer; and
   an initial value determining unit configured to determine an initial value of the first clock counter according to a column address strobe (CAS) latency.

5. The semiconductor memory device as recited in claim 4, wherein the replica delay line delays the output of the DLL reset synchronizer by the delay amount.

6. The semiconductor memory device as recited in claim 4, wherein the second timing computation unit comprises:
   an external clock synchronizer configured to transfer the output of the DLL reset synchronizer in synchronism with the falling edge of the system clock;
   a latch configured temporarily to store the output of the replica delay line in synchronism with the system clock;
   a multiplexer configured to transfer the output of the external clock synchronizer when the DLL circuit 0 is in the disabled state and transfer the output of the latch when the DLL circuit 0 is in the enabled state; and
   a second clock counter configured to count the rising edges of the system clock in response to the output of the multiplexer.

7. A semiconductor memory device, comprising:
   a delay locked loop (DLL) circuit enabled according to an operation mode and configured to compensate a delay amount of a system clock on a clock path to generate a DLL clock used as a reference of an internal operation; and
   a data output control circuit configured to compensate the delay amount when the DLL circuit 0 is enabled in such a state that the semiconductor memory device exits a reset state in response to an active signal, and to determine an output timing of data corresponding to a read command by counting the system clock and the DLL clock outputted from the DLL circuit 0 when the DLL circuit 0 is disabled, without compensating the delay amount.

8. The semiconductor memory device as recited in claim 7, wherein the data output control circuit comprises:
   a first timing computation unit configured to count the DLL clock after the semiconductor memory device exits the reset state;
   a replica delay line configured to delay the reset state exit by the delay amount;
   a second timing computation unit configured to count the system clock when the DLL circuit 0 is in the enabled state and the semiconductor memory device exits the reset state, and to count the system clock in response to the output of the replica delay line when the DLL circuit 0 is in the disabled state; and
   a data output timing computation unit configured to hold an output of the second timing computation unit when the read command is inputted, and determine the output timing based on a timing when the output of the second timing computation unit is equal to the output of the first timing computation unit.

9. The semiconductor memory device as recited in claim 8, wherein the first timing computation unit comprises:
   a DLL reset synchronizer configured to output an output reset signal, which is deactivated in response to the active signal, in synchronism with a falling edge of the DLL clock;
   a first clock counter configured to count rising edges of the DLL clock in response to an output of the DLL reset synchronizer; and
   an initial value determining unit configured to determine an initial value of the first clock counter according to a column address strobe (CAS) latency.

10. The semiconductor memory device as recited in claim 9, wherein the replica delay line delays the output of the DLL reset synchronizer by the delay amount.

11. The semiconductor memory device as recited in claim 10, wherein the second timing computation unit comprises:
   an external clock synchronizer configured to transfer the output of the DLL reset synchronizer in synchronism with the falling edge of the system clock;
   a latch configured to temporarily store the output of the replica delay line in synchronism with the system clock;
   a multiplexer configured to transfer the output of the external clock synchronizer when the DLL circuit 0 is in the disabled state and transfer the output of the latch when the DLL circuit 0 is in the enabled state; and
   a second clock counter configured to count the rising edges of the system clock in response to the output of the multiplexer.

12. The semiconductor memory device as recited in claim 11, wherein the data output timing computation unit comprises:
   a comparator configured to temporarily store an output value of the second clock counter when the read command is inputted, and output a delay signal at a timing at which an output value of the first clock counter is equal to the temporarily stored value;

a signal generator configured to output a plurality of output source pulses corresponding to the rising and falling edges of the system clock at the output timing of the comparator; and an output enable signal output buffer configured to determine the output timing by transferring the DLL clock during a period where one of the plurality of output source pluses is activated.

13. A method for operating a semiconductor memory device, comprising:

compensating a delay amount of a system clock on a clock path to generate a DLL clock activated according to an operation mode and used as a reference of an internal operation; and determining whether to compensate the delay amount according to the operation mode when a DLL circuit 0 is enabled in response to an active signal, and determining an output timing of data corresponding to a read command by counting the system clock and the DLL clock.

14. The method as recited in claim 13, wherein the determining of the output timing comprises:

counting the DLL clock after the semiconductor memory device exits the reset state;

delaying the reset state exit by the delay amount;

counting the system clock when the semiconductor memory device exits the reset state according to the operation mode, and counting the system clock in response to the output of a replica delay line when the DLL circuit 0 is in the disabled state; and determining the output timing based on a timing that the counting value of the system clock when the read command is inputted is equal to the counting value of the DLL clock.

15. The method as recited in claim 14, wherein the counting of the DLL clock comprises:

outputting an output reset signal, which is deactivated in response to the active signal, in synchronism with a falling edge of the DLL clock; and counting the rising edges of the DLL clock, from a start value set corresponding to a CAS latency, in response to an output signal synchronized with the falling edge of the DLL clock.

16. The method as recited in claim 15, wherein the counting of the system clock comprises:

compensating the delay amount of the output signal synchronized with the falling edge of the DLL clock according to the operation mode, and outputting the output signal in synchronism with the falling edge of the system clock; and counting the rising edges of the system clock in response to the output signal synchronized with the falling edge of the system clock.

17. The method as recited in claim 16, wherein the determining of the output timing comprises:

temporarily storing the counting value of the system clock when the read command is inputted, and outputting a delay signal at a timing at which the counting value of the DLL clock is equal to the temporarily stored counting value;

outputting a plurality of output source pulses corresponding to the rising and falling edges of the system clock at the output timing of the delay signal; and determining the output timing by transferring the DLL clock during a period where one of the plurality of output source pluses is activated.

18. A semiconductor memory device data output control circuit, comprising a compensation circuit configured to compensate a delay amount of a system clock on a clock path when a delay locked loop (DLL) circuit of a semiconductor memory device is enabled in such a state that the semiconductor memory device exits a reset state in response to an active signal, and a data output determination unit configured to determine a timing of data output corresponding to a read command by counting the system clock and a DLL clock outputted from the DLL circuit 0 when the DLL circuit 0 is disabled, without compensating the delay amount.

19. The semiconductor memory device data output control circuit as recited in claim 18, further comprising a first timing computation unit configured to count the DLL clock after the semiconductor memory device exits the reset state;

a replica delay line configured to delay the reset state exit by the delay amount, wherein said compensation circuit includes a second timing computation unit configured to count the system clock in response to an output of the replica delay line when the DLL circuit 0 is in the disabled state; and said data output determination unit include a data output timing computation unit configured to hold an output of the second timing computation unit when the read command is inputted, and to determine the output timing based on a timing when the output of the second timing computation unit is equal to the output of the first timing computation unit.

20. The semiconductor memory device as recited in claim 19, wherein the second timing computation unit counts the system clock, when the DLL circuit 0 is enabled and the semiconductor memory device exits the reset state.

* * * * *